United States Patent
Dijk et al.

(10) Patent No.: US 8,692,587 B1
(45) Date of Patent: Apr. 8, 2014

(54) SINGLE UNDER VOLTAGE MONITOR FOR GATE DRIVER CIRCUITS

(71) Applicant: NXP B.V., Eindhoven (NL)

(72) Inventors: Luc van Dijk, Kranenburg (DE); Issa Niakate, Nijmegen (NL); Matthijs Hoogeveen, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/730,323

(22) Filed: Dec. 28, 2012

(51) Int. Cl.
*H03K 3/00* (2006.01)

(52) U.S. Cl.
USPC .................. 327/108; 326/83; 361/92

(58) Field of Classification Search
USPC ......... 327/108–112, 427, 434, 436, 437, 170; 326/82, 83; 361/90, 92
See application file for complete search history.

(56) References Cited

U.S. PATENT DOCUMENTS

| | | | |
|---|---|---|---|
| 6,781,422 B1 * | 8/2004 | Yang .............................. | 327/108 |
| 6,982,574 B2 * | 1/2006 | Harriman et al. ............ | 327/108 |
| 7,368,957 B2 * | 5/2008 | Clarkin et al. ................ | 327/110 |
| 2004/0120090 A1 | 6/2004 | Galli et al. | |
| 2005/0012491 A1 | 1/2005 | Ni et al. | |
| 2005/0140347 A1 | 6/2005 | Chen et al. | |
| 2005/0248322 A1 | 11/2005 | Kagemoto et al. | |
| 2012/0000519 A1 | 1/2012 | Frey | |

OTHER PUBLICATIONS

Webb, Daniel, et al., "Measuring individual cell voltages in fuel cell stacks", Journal of Power Sources, vol. 103, Issue 1, Dec. 30, 2001, pp. 54-60.*
"Voltage Interface Basics", Apr. 6, 2004, http://www.acroname.com/robotics/info/articles/interface/interface.html.*

* cited by examiner

*Primary Examiner* — Lincoln Donovan
*Assistant Examiner* — Thomas Skibinski

(57) ABSTRACT

A gate driver including: a first input; a first output driver having a first gate drive signal output, wherein the first output driver is connected to the first input; a second input; a second output driver having a second gate drive signal output, wherein the second output driver is connected to the second input; a first converter configured to convert an input voltage level to a first converted voltage level, wherein the converter receives an input voltage from a first high side gate driver output; a multiplexer with a first input connected to the first converter, a second input connected to a low side output, and an output; and an under voltage monitor connected to the output of the multiplexer.

19 Claims, 4 Drawing Sheets

SINGLE UNDER VOLTAGE MONITOR FOR GATE DRIVER CIRCUITS

TECHNICAL FIELD

Various exemplary embodiments disclosed herein relate generally to under voltage monitors for gate-driver circuits.

BACKGROUND

In various electrical applications (for example, automotive), there may be loads (for example motors, pumps, or light bulbs) that require high drive currents. These high currents need to be switched on and off in order to enable or disable the load. This may be done using semiconductor switches, for example, MOSFETs, and the circuitry needed to drive the semiconductor switches may be referred to as gate driver circuitry. These gate drivers may need to carefully monitor the voltage that is applied to the semiconductor switches driven by the gate driver circuitry, with under voltage monitors (UV monitors) in order to properly drive the semiconductor switches. Current gate driver implementations include multiple under voltage monitors, and because such monitors operate in different voltage domains, the performance of such monitors may vary. The use of multiple UV monitors is also undesirable in that die size and cost are increased. Additionally, UV monitors on the high-side channel(s) consume current drawn from a bootstrap capacitor(s). This means the capacitors either need be increased or the switching frequency of the application needs to be decreased. Also, if too much current is drawn from the bootstrap capacitor, undesirable system undervoltages may result.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to gate driver including: a first input; a first output driver having a first gate drive signal output, wherein the first output driver is connected to the first input; a second input; a second output driver having a second gate drive signal output, wherein the second output driver is connected to the second input; a first converter configured to convert an input voltage level to a first converted voltage level, wherein the converter receives an input voltage from a first high side gate driver output; a multiplexer with a first input connected to the first converter, a second input connected to a low side output, and an output; and an under voltage monitor connected to the output of the multiplexer.

Further, various exemplary embodiments relate to a switching circuit comprising: a gate driving comprising: a first input; a first output driver having a first gate drive signal output, wherein the first output driver is connected to the first input; a second input; a second output driver having a second gate drive signal output, wherein the second output driver is connected to the second input; a first converter configured to convert an input voltage level to a first converted voltage level, wherein the converter receives an input voltage from a first high side gate driver output; a multiplexer with a first input connected to the first converter, a second input connected to a low side gate driver output, and an output; and an under voltage monitor connected to the output of the—multiplexer; a first semiconductor switch having a gate connected to HG; and a second semiconductor switch having a gate connected to LG and a source connected to a drain of the first semiconductor switch.

Further, various exemplary embodiments relate to a method of driving first and second semiconductor switches to turn a load on and off using a gate driver, including: receiving at the gate driver a first input control signal; producing a first output driver signal based upon the first input control signal; receiving at the gate driver a second input control signal; producing a second output driver signal based upon the second input control signal; converting an input voltage from a first high side gate driver output to a first converted voltage level; selecting one of the first converted voltage level and a voltage level at a first low side gate driver output; and detecting an under voltage condition based upon the selected voltage level.

BRIEF DESCRIPTION OF THE DRAWINGS

In order to better understand various exemplary embodiments, reference is made to the accompanying drawings, wherein.

To facilitate understanding, identical reference numerals (or reference numerals incremented by a constant value n (i.e., 200, 300, 400)) have been used to designate elements having substantially the same or similar structure and/or substantially the same or similar function.

DETAILED DESCRIPTION

Figure 1:
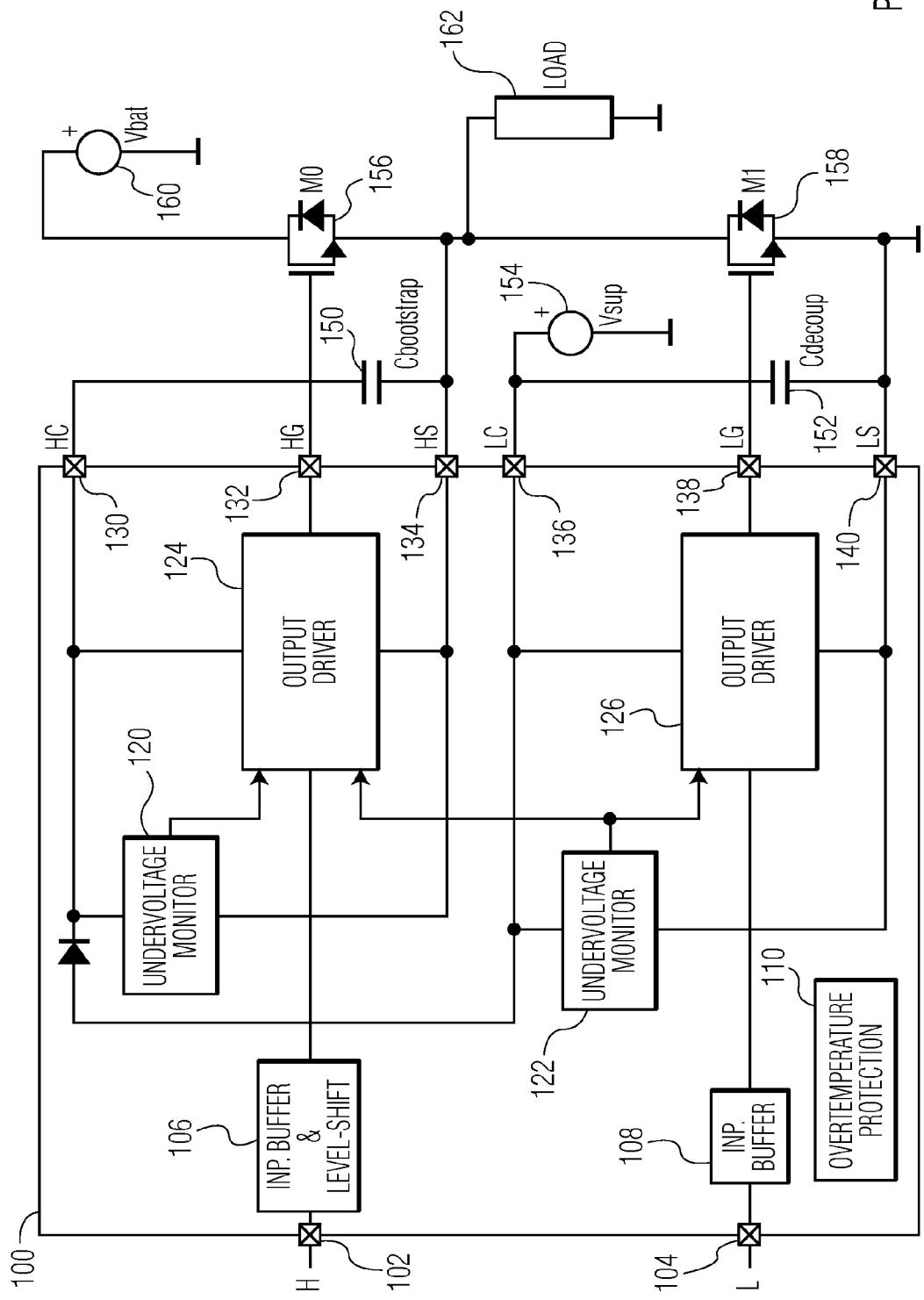
FIG. 1 illustrates a related art switching circuit that drives power semiconductor devices including a gate driver having under voltage monitors.

FIG. 1 illustrates a related art switching circuit that drives power semiconductor devices including a gate driver having under voltage monitors. The switching circuit may be attached to a high current load. The high current load may be switched on and off using semiconductor switches M0 and M1. The semiconductor switches may be high power MOSFETs, but other types of semiconductor switches may be used as well, for example, GaN, SiC, IGBT, etc.

It is important that the semiconductor switches M0 and M1 are driven with a large supply voltage in order to keep the semiconductor switches M0 and M1 in linear operation mode. When the supply voltage is not large enough, the semiconductor switches M0 and M1 may operate in saturation mode causing too much dissipation in the semiconductor switches M0 and M1. Accordingly, under voltage monitors 120, 122 may be implemented both on the "low side channel" as well as on the "high-side channel." Two under voltage monitors are necessary because an under voltage on the "high-side channel" does not necessary mean the voltage at LC (or LC-LS) is too low. An under voltage on the "high-side channel" may result from an error with the bootstrap capacitor 150 or too much current being drawn from the bootstrap capacitor 150.

In FIG. 1, a gate driver 100 may include high input 102 and low input 104. The high input 102 may receive a control signal used to drive the "high-side channel," and the low input 104 may receive a control signal used to drive the "low side channel." The high side channel controls the on/off state of the semiconductor switch M0 that applies a voltage to the load 162. The low side channel controls the on/off state of semiconductor switch M1 that grounds the load 162. The gate driver control signals typically may be provided by a digital controller (not shown). Such digital controllers may not be capable of providing enough current to drive directly the gates of the semiconductor switches M0 and M1. Accordingly, the gate driver 100 includes the depicted additional components to generate the current necessary to drive the semiconductor switches M0 and M1.

The gate driver 100 may include high-side output HG 132 that drives the gate of M0, low side output LG 138 that drives the gate of M1. Further, the gate driver 100 may include nodes HC 130, HS 134, LC 136, and LS 140.

A bootstrap capacitor 150 may be attached between HC 130 and HS 134. A decoupling capacitor 152 may be attached between LC 136 and LS 140. A voltage supply Vsup 154 may be connected to LC 136. A load 162 may be attached between ground and HS 134. The load 162 and HS may also be connected to a junction between the semiconductor switches M0 and M1.

The semiconductor switch M0 may have a source attached to a power source Vbat 160, a drain attached to HS and the load, and a gate attached to HG 132 of the gate driver 100. The semiconductor switch M1 may have a source attached to HS 134, the load 162, and drain of switch M0 156, a drain of switch M1 is attached to LS and ground, and a gate of M1 is attached to LG 138 of the gate driver 100.

The gate driver 100 may include input buffer and level-shifter 106, input buffer 108, under voltage monitors 120, 122, and output drivers 124, 126 (it will be understood that these elements are arranged for the high- and low-side channels). The gate driver 100 may be implemented as a single integrated circuit (IC) or as part of an IC that includes other functions. The input buffer and level shifter 106 may be connected between the high input 102 and the output driver 124. The input buffer and level shifter 106 may receive and buffer control signals used to control the semiconductor switch M0. The input buffer and level shifter 106 may also shift the level associated with the control signals. Likewise, the input buffer 108 may receive and buffer a control signal used to control the semiconductor switch M1. The output driver 124 may receive control signals from the input buffer and level shifter 106. The output driver 124 may also receive control signals from the under voltage monitors 120, 122. Likewise, the output driver 126 may receive control signals from the input buffer 108. The output driver 126 may also receive control signals from the under voltage monitor 122.

The under voltage monitor 120 may detect the voltage between the nodes HC 130 and HS 134. Further, the under voltage monitor 120 may be connected to the output driver 124. When an under voltage condition exists, the under voltage monitor 120 may send a control signal to the output driver 124 to turn off the output driver 124. Likewise, the under voltage monitor 122 may detect the voltage between the nodes LC 136 and LS 140. Further, the under voltage monitor 122 may be connected to the output driver 126. When an under voltage condition exists, the under voltage monitor 122 may send a control signal to the output driver 126 to turn off the output driver 126

Operation of the switching circuit 100 will now be described. The power to the load 162 may be supplied by a power source 160. The semiconductor switch M0 may be connected between the power source 160 and the load 162, and the semiconductor switch M0 may be controlled to turn on and off in order to supply power to the load 162 as desired. Another semiconductor switch M1 may be connected between the load 162 and ground, and the semiconductor switch M1 may be controlled to turn on and off in order to ground the load 162 as desired. The semiconductor switches M0 and M1 may act in tandem to turn the load 162 on and off. When semiconductor switch M0 is on to supply power to the load 162, the semiconductor switch M1 is off. Alternatively, when semiconductor switch M1 is on to ground the load 162, the semiconductor switch M0 is off. The semiconductor switches M0 and M1 may be turned on and off respectively by a signal applied to their gates. Because semiconductor switches M0 and M1 may be supplying a high current to the load and hence high power, the semiconductor switch M0 and M1 may be high power semiconductors. Accordingly, the switching signals needed to actuate the semiconductor switches require more power than typically can be supplied by typical electronic controllers. Therefore, the switching circuit 100 may receive switching control signals at high input 102 and low input 104 from a controller. The switching circuit then produces high power control signals at the high-side output HG 132 and the low side output LG 138 to switch the semiconductor switches M0 and M1 on and off.

On the high side of the switching circuit 100, a control signal may be received at the high input 102 that is then fed to the input buffer and level shifter 106. The input buffer 106 then feeds the signal to the output driver that produces the high power gate drive signal at the high side output HG 132 to drive semiconductor switch M0. One concern in driving high power semiconductor switches is under voltage situations. When the drive voltage at the gate of the semiconductor switch is not high enough, the semiconductor switch drops out of linear mode into a saturation mode where switching losses will increase and lead to malfunction, nonfunction, or damage. In order to prevent such operation and the associated ohmic losses, an under voltage monitor 120 may be used to detect when the voltage drops below a desired level indicating a potential operational problem with the semiconductor switch M0. Accordingly, the under voltage monitor 120 monitors voltage at the semiconductor switch M0 and supplies a control signal to the output driver 124. When the under voltage monitor detects an under voltage condition, the under voltage monitor may send a shut off control signal to the output driver 124.

This high side of the gate driver circuit 100 may also include a bootstrap capacitor 150 that helps to maintain a voltage difference between the HC node 130 and the HS node 134 as well as providing current to allow for fast switching of the semiconductor switch M0.

The low side of the gate driver 100 has a similar structure, as the high side and operates in a similar manner in order to drive the semiconductor switch M1. One difference between the high side and low side under voltage monitors is that they each operate over different voltage ranges. Also, the two under voltage monitors may be necessary because an under voltage on the high side channel does not necessarily mean that the voltage on the low side is too low. For example, a low high side voltage may be due to an error with the bootstrap capacitor 150 or because too much current is drawn from the bootstrap capacitor 150.

It is important to realize that in FIG. 1 there is one low side channel as well as one high side channel depicted. There may also be devices that integrate two low side channels as well as two high side channels which are so called "full-bridge drivers." These devices may have two under voltage monitors on the high side as well as one under voltage monitor on the low side channels. Further, there may be three low side and three high side channels integrated in one gate drive which are so called "three phase drivers". These devices may include three under voltage monitors on the high side as well as one under voltage monitor on the low side channel.

There are multiple problems related to the under voltage monitors as depicted in FIG. 1. The first problem is related to the fact that characteristics of the under voltage monitor (in particular the threshold levels) may not be identical even when the under voltage monitors are the exact same circuits implemented multiple times (e.g., twice in a half-bridge driver, three times in a full-bridge drive, and four times in a three-phase driver). The reason is that the under voltage monitor on the low side channel(s) is relative to ground, while the under voltage monitor(s) monitoring the difference between HC and HS are not relative to ground, but HS varies between 0 V and Vbat while HC varies between Vsup and Vbat+Vsup. This may affect the devices used to realize the under voltage monitor and this in the end may affect the characteristics of the under voltage monitor.

Another problem with the gate driver 100 in FIG. 1 is that multiple under voltage monitors may be required (e.g., two for the half-bridge driver, three for the full-bridge driver and four for the three-phase driver). This may increase the size of the IC and also system costs.

A final problem with the gate driver 100 in FIG. 1 is that the under voltage monitors on the high side channel(s) may consume some current, and that current may be drawn from the bootstrap-capacitor(s). This means that either this capacitor(s) may need to be enlarged, which may increase cost, or the switching frequency in the application may need to be decreased, which may be undesirable. When too much current is drawn from the bootstrap capacitor, under voltage may occur in the system, and this should be avoided at all times.

Figure 2:
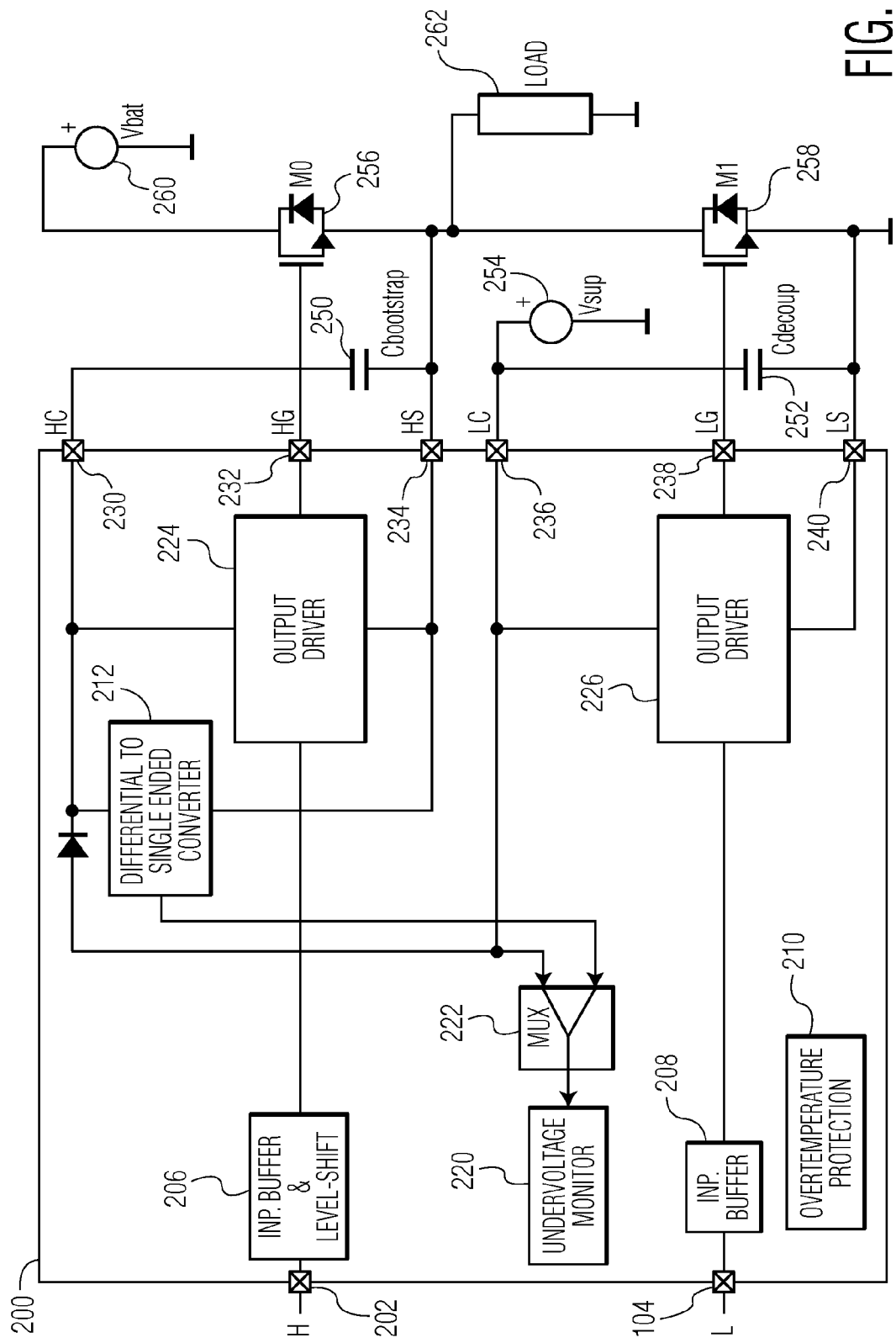
FIG. 2 illustrates an embodiment of a switching circuit that drives power semiconductor devices including a gate driver having an under voltage monitor.

FIG. 2 illustrates an embodiment of a switching circuit that drives power semiconductor devices including a gate driver having an under voltage monitor. The switching circuit of FIG. 2 has many similarities to the switching circuit of FIG. 1. In FIG. 2, a gate driver 200 may include high input 202 and low input 204. The high input 202 may receive a control signal used to drive the "high side channel," and the low input 204 may receive a control signal used to drive the "low side channel." The gate driver control signals typically may be provided by a digital controller (not shown). Such digital controllers may not be capable of providing enough current to drive directly the gates of the semiconductor switches M0 and M1. Accordingly, the gate driver 200 may be used to generate the current necessary to drive the semiconductor switches M0 and M1.

The gate driver 200 may include high side output HG 232 that drives the gate of M0 256, and low side output LG 238 that drives the gate of M1 258. Further, the gate driver 200 may include nodes HC 230, HS 234, LC 236, and LS 240.

A bootstrap capacitor 250 may be attached between HC 230 and HS 234. A decoupling capacitor 252 may be attached between LC 236 and LS 240. A voltage supply Vsup 254 may be connected to LC 236. A load 262 may be attached between ground and HS 234. The load 262 and HS may also be connected to a junction between the semiconductor switches M0 and M1.

The semiconductor switch M0 256 may have a source attached to a power source Vbat 260, a drain attached to HS 234 and the load 262, and a gate attached to HG 232 of the gate driver 200. The semiconductor switch M1 258 may have a source attached to HS 234, the load 262, and drain of M0 256, a drain attached to LS 240 and ground, and a gate attached to LG 238 of the gate driver 200.

The gate driver 200 may include input buffer and level-shifter 206, input buffer 208, under voltage monitor 220, multiplexer 222, differential to single ended converter 212, and output drivers 224, 226. The input buffer and level shifter 206 may be connected between the high input 202 and the output driver 224. The input buffer and level shifter 206 may receive and buffer control signals used to control the semiconductor switch M0 256. The input buffer and level shifter 206 may also shift the level associated with the control signals. Likewise, the input buffer 208 may receive and buffer control signal used to control the semiconductor switch M1 258. The output driver 224 may receive control signals from the input buffer and level shifter 206. The output driver 224 may also receive a control signal from the under voltage monitor 220. Likewise, the output driver 226 may receive control signals from the input buffer 208. The output driver 226 may also receive a control signal from the under voltage monitor 220.

The under voltage monitor 220 may receive a voltage from the multiplexer 222. The multiplexer 222 may receive input two input voltages. The first is from the LC node 236, and the second is from the differential to single ended converter 212. The converter 212 may convert the high side voltage between HC 230 and HS 234 to a lower value in the same range as the voltage at LC 236. The converter 212 may offset the voltage level by a specified amount, scale the voltage level, or both so as to output a voltage that has similar under voltage characteristics as the voltage signal at LC 236. This may allow the single under voltage monitor 220 to detect under voltage conditions on both the high side and the low side channels. Because the converter 212 scales the high side voltage, a single under voltage monitor 220 may be used. The multiplexer 222 selects a voltage to apply to the under voltage monitor 220. Further, the converter 212 may be any type of voltage converter that converts the input voltage into an output voltage in a desired voltage range. Such converters may have inputs and outputs that are either single or double ended.

The multiplexer 222 may use different methods of switching between the input voltages it receives. In one example the multiplexer 222 may choose the input voltage to correspond with the semiconductor switch that is closed. For example, if semiconductor switch M0 256 is closed to turn on the load 262, the multiplexer 222 may select the voltage from the converter 212. When the semiconductor switch M1 258 is closed to turn the load 262 off, the multiplexer 222 may select the voltage from the node LG 236. Alternatively, the multiplexer may automatically switch back and forth between the two inputs at some predetermined rate so as to continuously be determining if an under voltage condition occurs on either the high side or the low side. Other control methods may be used depending on the specific operating conditions and requirements of the gate driver 200.

The operation of the switching circuit in FIG. 2 is otherwise similar to the operation of the circuit in FIG. 1. A major advantage of the gate driver 200 is that it includes only one under voltage monitor rather than multiple under voltage monitors. This may lead to the following further advantages. The gate driver 200 may be implemented on an integrated circuit, therefore using a single under voltage monitor may lead to significant area reduction of the circuit even when the converter 212 and the multiplexer 222 are included versus two under voltage monitors. The controller and multiplexer 222 are less complex circuits that do not require very much space on the integrated circuit. Using a single under voltage monitor is also advantageous because this avoids a problem which may result when more than one under voltage monitor is used, in that there may be a difference in the characteristics of the under voltage monitors leading to malfunctions of the gate driver 200, accordingly the use of a single under voltage monitor prevents such malfunctions. Because there is no under voltage monitor implemented on the high side channel of the gate driver 200, a large current draw from the bootstrap capacitor 250 by a high side under voltage monitor may be avoided.

Figure 3:
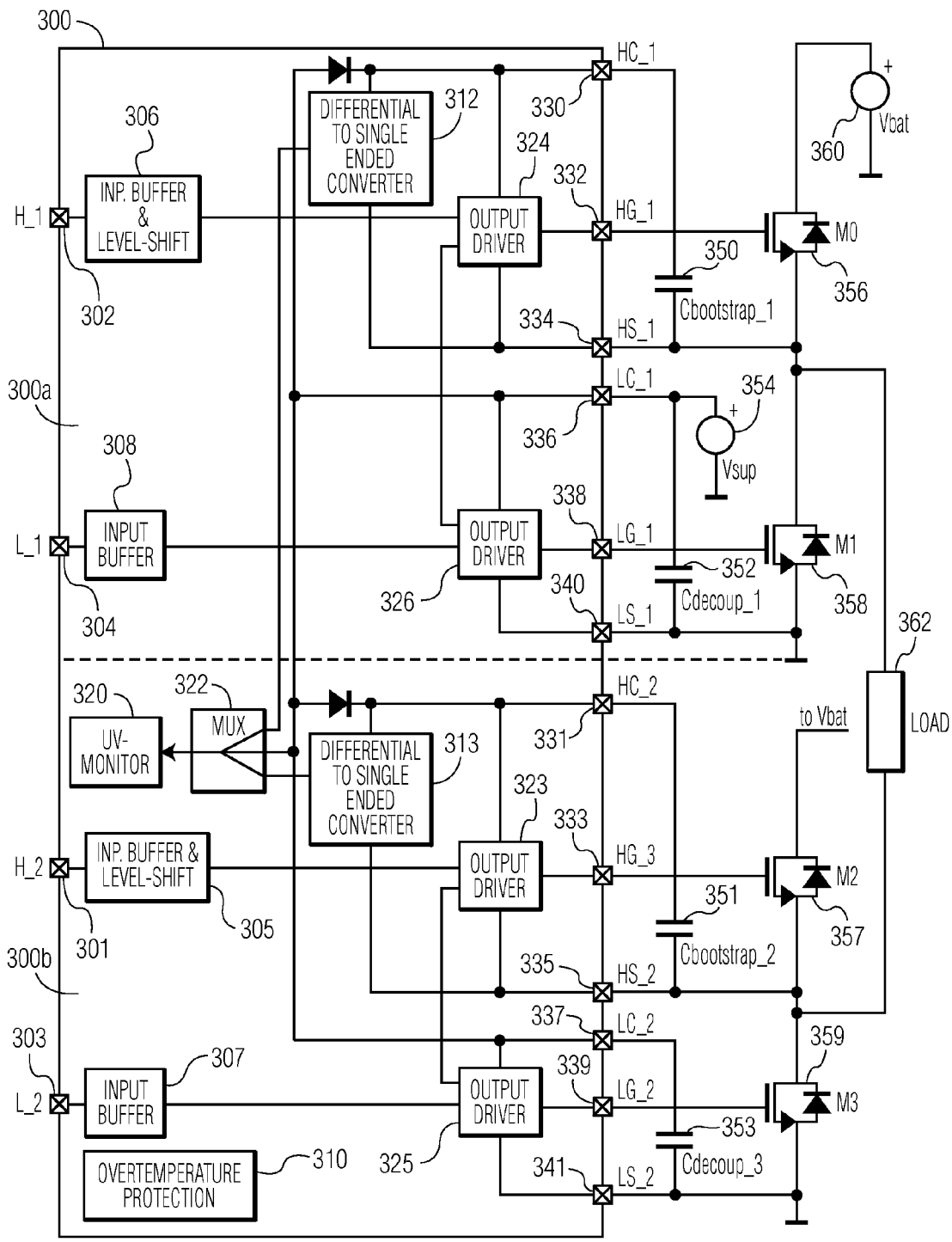
FIG. 3, illustrates another embodiment of a switching circuit that drives power semiconductor devices including a full-bridge gate driver having an under voltage monitor.

FIG. 3, illustrates another embodiment of a switching circuit that drives power semiconductor devices including a full-bridge gate driver having an under voltage monitor 320. The switching circuit 300 of FIG. 3 is similar in structure to the switching circuit 200 in FIG. 2 (and so components already described in connection with FIG. 2 will not be specifically described again), but instead has first gate driver section 300a that drives semiconductor switches M0 356 and M1 358 to drive a first terminal of the load 362, and a second gate driver section 300b that drives semiconductor switches M2 357 and M3 359 to drive a second terminal of the load 362. The multiplexer 322 may receive three input voltages from a first differential to single ended converter 312, a second differential to single ended converter 313, and the node LC_2 337. As described above the multiplexer 322 may switch between the inputs to detect under voltage situations. Such switching may occur in numerous ways such as described above. The converter 312 may convert the high side voltage between HC_1 330 and HS_1 334 to a lower value in the same range as the voltage at LC_2 337. Likewise, the converter 313 may convert the high side voltage between HC_2 331 and HS_2 335 to a lower value in the same range as the voltage at LC_2 337. The converters 312, 313 may offset voltage levels by a specified amount, scale the voltage level, or both so as to output a voltage that has similar under voltage characteristics as the voltage signal at LC 236. For the full-bridge gate driver, three under voltage monitors may be replaced by a single under voltage monitor.

Figure 4:
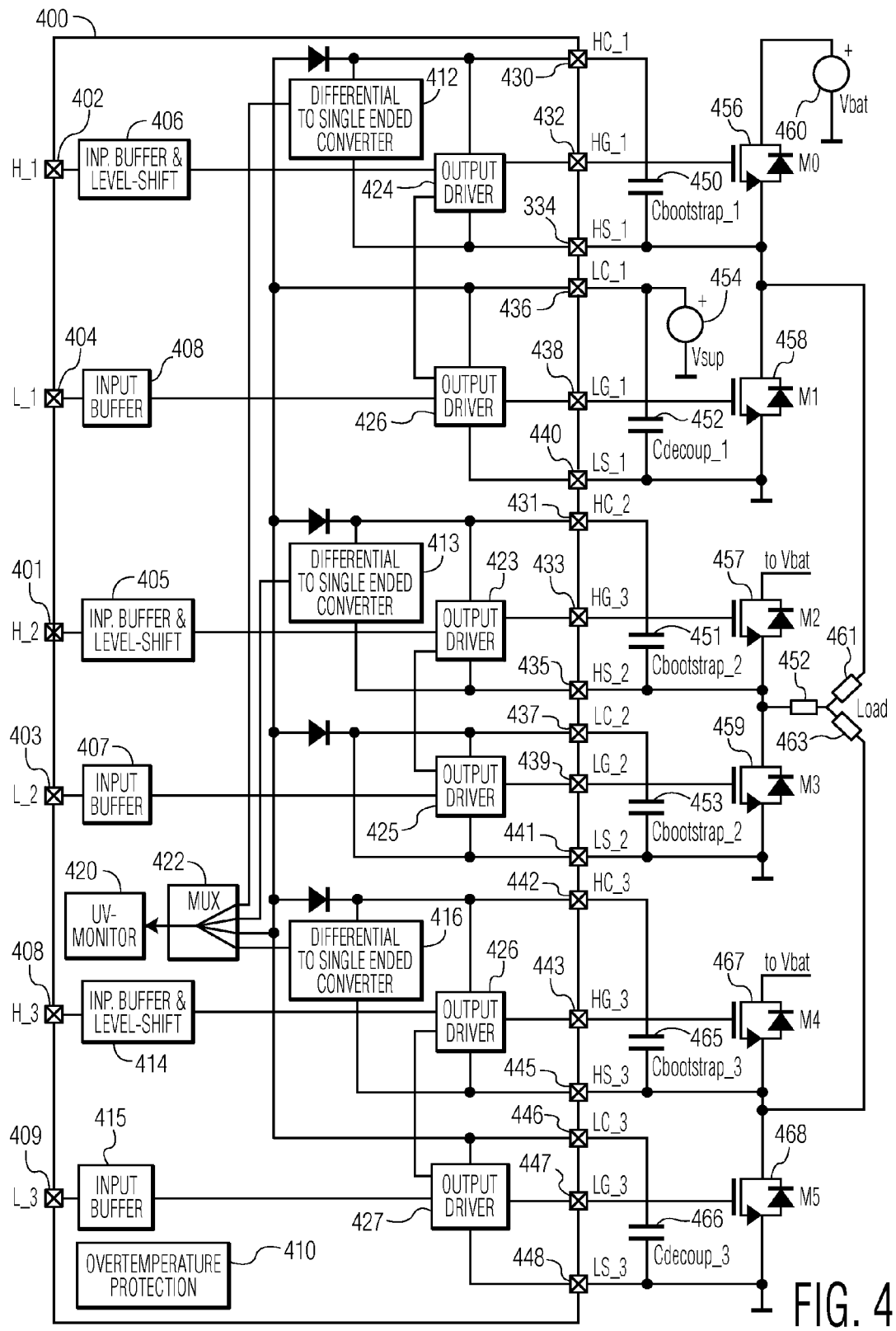
FIG. 4 illustrates another embodiment of a switching circuit that drives power semiconductor devices including a three-phase gate driver having an under voltage monitor.

FIG. 4 illustrates another embodiment of a switching circuit that drives power semiconductor devices including a three-phase gate driver having an under voltage monitor 420. The switching circuit 400 of FIG. 4 is similar in structure to the switching circuit 200 in FIG. 2 and the switching circuit 300 in FIG. 3, but instead has gate driver 400 to drive the three-phase loads 461, 462, 463. The multiplexer 422 may receive four input voltages. The input voltages may be received from each of the differential to single ended converters 412, 413, 416 and the port LC_3 446. As described above the multiplexer 422 may switch between the inputs to detect under voltage situations. Such switching may occur in numerous ways as described above. For the three-phase gate driver, four under voltage monitors may be replaced by a single under voltage monitor.

The gate driver embodiments described above may be used in any situation where the switching of high currents and/or voltages may be required. Many such applications are found, for example, in automobiles. These automobile applications may include antilock braking systems (ABS), electronic stability programs (ESP), electronic power steering (EPS), electronic parking brake (EPB), window-lifters (WL), etc.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A gate driver comprising:
a first input;
a first output driver having a first high side voltage, wherein the first output driver is connected to the first input;
a second input;
a second output driver having a first low side voltage, wherein the second output driver is connected to the second input;
a first converter configured to convert an input voltage level to a first converted voltage level, wherein the first converter receives an input voltage from the first high side voltage;
a multiplexer with a first input connected to the first converter, a second input connected to the first low side voltage, and an output; and
an under voltage monitor connected to the output of the multiplexer.

2. The gate driver of claim 1, wherein the first converter is configured to perform at least one of offsetting and scaling the input voltage level.

3. The gate driver of claim 1, wherein the under voltage monitor sends a control signal to the first and second output drivers to switch an on/off state of the first and second output drivers.

4. The gate driver of claim 1, wherein the multiplexer switches between inputs based upon the on/off states of the first and second output drivers.

5. The gate driver of claim 1, wherein the multiplexer switches between inputs periodically based upon predefined intervals.

6. The gate driver of claim 1, further comprising:
a third input;
a third output driver having a second high side voltage, wherein the third output driver is connected to the third input;
a fourth input;
a fourth output driver having a second low side voltage, wherein the fourth output driver is connected to the fourth input; and
a second converter configured to convert an input voltage level to a second converted voltage level, wherein the second converter receives an input voltage from the second high side voltage and has an output connected to the multiplexer.

7. A switching circuit comprising:
a gate driver comprising:
a first input;
a first output driver having a first high side voltage, wherein the first output driver is connected to the first input;
a second input;
a second output driver having a first low side voltage, wherein the second output driver is connected to the second input;
a first converter configured to convert an input voltage level to a first converted voltage level, wherein the first converter receives an input voltage from the first high side voltage;

a multiplexer with a first input connected to the first converter, a second input connected to the first low side voltage, and an output; and an under voltage monitor connected to the output of the multiplexer;

a first semiconductor switch having a gate connected to a high side output; and a second semiconductor switch having a gate connected to a low side output and a source connected to a drain of the first semiconductor switch.

8. The switching circuit of claim 7, wherein the first converter is configured to offset the input voltage level.

9. The switching circuit of claim 7, wherein the under voltage monitor sends a control signal to the first and second output drivers to switch an on/off state of the first and second output drivers.

10. The switching circuit of claim 7, wherein the multiplexer switches between inputs based upon on/off states of the first and second output drivers.

11. The switching circuit of claim 7, wherein the multiplexer switches between inputs periodically based upon predefined intervals.

12. The switching circuit of claim 7, further comprising:
a bootstrap capacitor connected in parallel with the first converter.

13. The switching circuit of claim 7, further comprising:
a third input;
a third output driver having a second high side voltage, wherein the third output driver is connected to the third input;
a fourth input;
a fourth output driver having a second low side voltage, wherein the fourth output driver is connected to the fourth input; and
a second converter configured to convert an input voltage level to a second converted voltage level, wherein the second converter receives an input voltage from the second high side voltage and has an output connected to the multiplexer.

14. The switching circuit of claim 7, wherein the first converter is configured to scale the input voltage level.

15. A method of driving first and second semiconductor switches to turn a load on and off using a gate driver, comprising:

receiving, at the gate driver, a first input control signal;

producing a first output driver signal based upon the first input control signal;

receiving, at the gate driver, a second input control signal;

producing a second output driver signal based upon the second input control signal;

converting an input voltage from a first high side voltage to a first converted voltage level;

selecting one of the first converted voltage level and a first low side voltage; and detecting an under voltage condition based upon the selected voltage level.

16. The method of claim 15, further comprising:
when the under voltage condition is detected, turning off one of the first or second output driver signals.

17. The method of claim 15, further comprising:
receiving, at the gate driver, a third input control signal;
producing a third output driver signal based upon the third input control signal;
receiving, at the gate driver, a fourth input control signal;
producing a fourth output driver signal based upon the fourth input control signal; and
converting an input voltage from a second high side voltage to a second converted voltage level.

18. The method of claim 17, further comprising:
selecting among the first converted voltage level, the second converted voltage level, and the first low side voltage.

19. The method of claim 15, wherein the gate driver is a three-phase gate driver.

* * * * *